United States Patent
Azad

(10) Patent No.: US 9,411,701 B2
(45) Date of Patent: Aug. 9, 2016

(54) ANALOG BLOCK AND TEST BLOCKS FOR TESTING THEREOF

(71) Applicant: Xilinx, Inc., San Jose, CA (US)

(72) Inventor: Sarosh I. Azad, Fremont, CA (US)

(73) Assignee: XILINX, INC., San Jose, CA (US)

( * ) Notice: Subject to any disclaimer, the term of this patent is extended or adjusted under 35 U.S.C. 154(b) by 531 days.

(21) Appl. No.: 13/802,223

(22) Filed: Mar. 13, 2013

(65) Prior Publication Data

US 2014/0281716 A1    Sep. 18, 2014

(51) Int. Cl.
  *G01R 31/3167*    (2006.01)
  *G06F 11/27*      (2006.01)
  *G01R 31/317*     (2006.01)

(52) U.S. Cl.
  CPC ............ *G06F 11/27* (2013.01); *G01R 31/3167* (2013.01); *G01R 31/3171* (2013.01); *G01R 31/31716* (2013.01)

(58) Field of Classification Search
  CPC ........... G01R 31/3167; G01R 31/2884; G01R 31/3025; G06F 17/5036
  See application file for complete search history.

(56) References Cited

U.S. PATENT DOCUMENTS

| | | | |
|---|---|---|---|
| 7,315,177 B1 | 1/2008 | Seif | |
| 7,454,658 B1 | 11/2008 | Baxter | |
| 7,571,360 B1 * | 8/2009 | Lewicki et al. | 714/704 |
| 7,743,288 B1 | 6/2010 | Wang | |
| 2002/0094055 A1 * | 7/2002 | Cranford et al. | 375/376 |
| 2004/0031857 A1 * | 2/2004 | Sato | 235/492 |
| 2005/0065747 A1 * | 3/2005 | Premy et al. | 702/120 |
| 2010/0097087 A1 * | 4/2010 | Hogeboom et al. | 324/763 |
| 2011/0039509 A1 * | 2/2011 | Bruchner | 455/232.1 |
| 2011/0244814 A1 * | 10/2011 | Andreu et al. | 455/90.1 |
| 2012/0072785 A1 * | 3/2012 | Ding et al. | 714/704 |

* cited by examiner

*Primary Examiner* — Jigar Patel
(74) *Attorney, Agent, or Firm* — W. Eric Webostad; John J. King

(57) ABSTRACT

An apparatus relating generally to a system-on-chip is disclosed. In this apparatus, the system-on-chip has at least one analog block, an input/output interface, a data test block, and a processing unit. The processing unit is coupled to the input/output interface to control access to the at least one analog block. The data test block is coupled to the at least one analog block through the input/output interface. The processing unit is coupled to the data test block and configured to execute test code having at least one test pattern. The data test block under control of the test code executed by the processing unit is configured to test the at least one analog block with the test pattern.

19 Claims, 5 Drawing Sheets

ANALOG BLOCK AND TEST BLOCKS FOR TESTING THEREOF

FIELD OF THE INVENTION

The following description relates to integrated circuit devices ("ICs"). More particularly, the following description relates to an analog block and test blocks for testing thereof for an IC.

BACKGROUND

Programmable devices such as a programmable logic device ("PLD") may have many components. In the past, generally significant components of a PLD could be tested by programming programmable resources (e.g., "fabric") for a built-in self-test ("BIST") system provided via a configuration bitstream in such fabric. However, PLDs have progressed into system-on-chips ("SoCs"), and not all significant components to be tested may be accessed via fabric for such BIST system instantiated testing. Along those lines, one or more analog blocks may be decoupled from such fabric, and so may not be accessible for such BIST system testing via fabric.

Hence, it would be useful to provide an SoC in which an analog block can be tested.

SUMMARY

An apparatus relates generally to a system-on-chip. In such an apparatus, the system-on-chip has at least one analog block, an input/output interface, a data test block, and a processing unit. The processing unit is coupled to the input/output interface to control access to the at least one analog block. The data test block is coupled to the at least one analog block through the input/output interface. The processing unit is coupled to the data test block and configured to execute test code having at least one test pattern. The data test block under control of the test code executed by the processing unit is configured to test the at least one analog block with the test pattern.

A method relates generally to testing an analog block. In such a method, the analog block includes looping back a data sequence. Configuration information is provided to a configuration controller of a link test block. An analog block is configured under control of the configuration controller responsive to the configuration information. The data sequence is received by a bit error rate tester of the link test block from the analog block. The bit error rate tester is configured with test pattern information. The data sequence is responsive to a test pattern associated with the test pattern information. A bit error rate is determined by the bit error rate tester for the data sequence. The bit error rate is output.

A method relates generally to generating a data eye. Configuration information is provided to a configuration controller of a link test block. An analog block under control of the configuration controller is configured responsive to the configuration information. Application data is received by an eye scan controller of the link test block from the analog block via a first input/output bus. A data eye is generated by the eye scan controller responsive to the application data. The data eye is for settings of the analog block responsive to the configuration information. The data eye is output.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
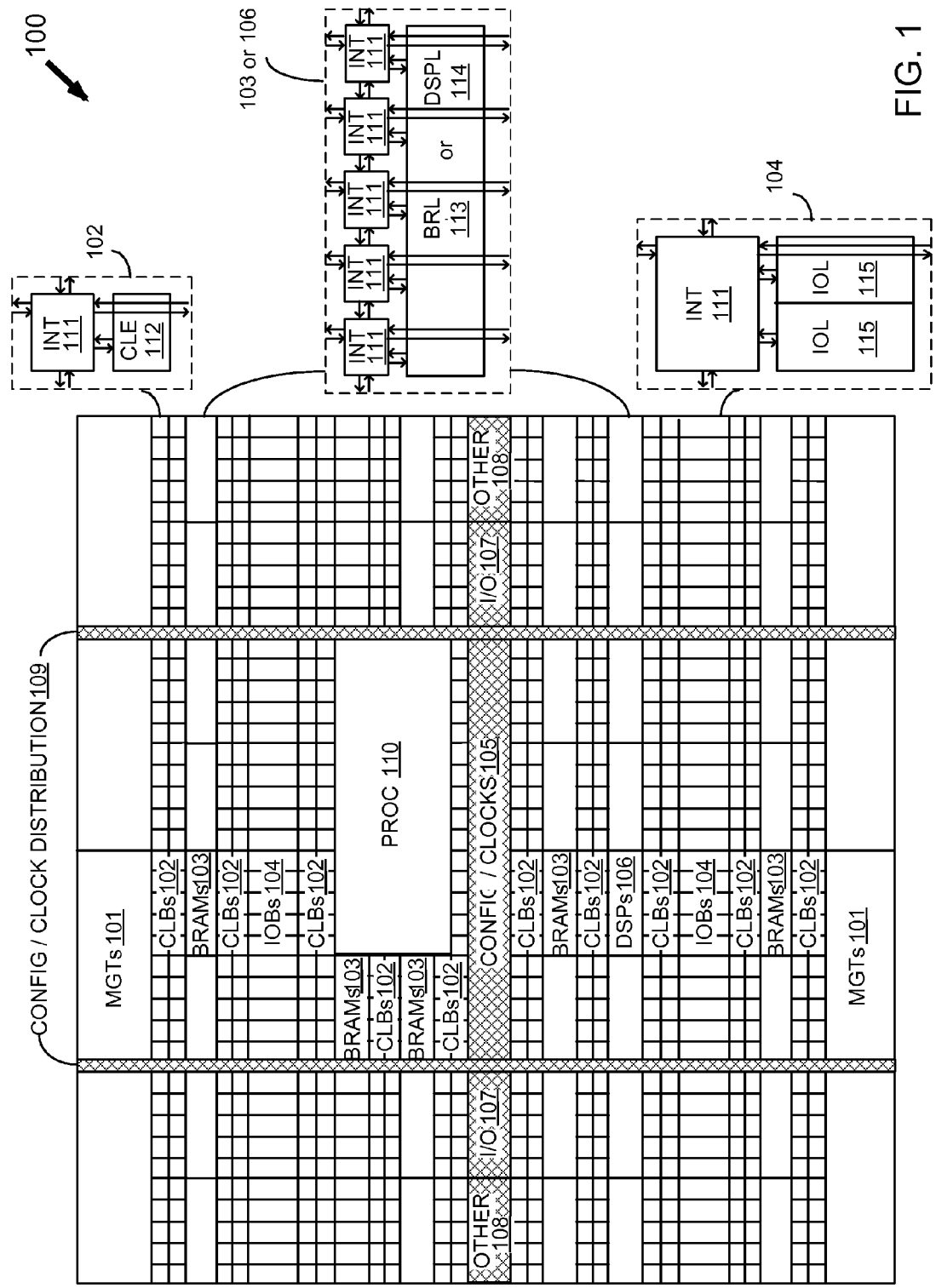
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding. Programmable devices, such as a programmable logic device ("PLD"), may have many components. In the past, generally significant components of a PLD could be tested by programming programmable resources (e.g., "fabric") for a built-in self-test ("BIST") system provided via a configuration bitstream in such fabric. However, PLDs have progressed into system-on-chips ("SoCs"), and not all components to be tested may be coupled to fabric for such BIST system instantiated in fabric. Along those lines, analog blocks may be decoupled from such fabric.

As described below in additional detail, embedded test blocks are described for testing one or more analog blocks of an SoC. In particular, testing of an analog-based SERDES is described. Even though the following description is in terms of an SoC, such SoC may be one of many SoCs on a monolithic die or on a multi-die package, such as in a stacked die package with or without an interposer for stacking die.

With the above general understanding borne in mind, various embodiments for SoCs are generally described below.

Because one or more of the above-described examples are described herein using a particular type of IC, a detailed description of such an IC is provided below. However, it should be understood that other types of ICs may benefit from one or more of the techniques described herein. For instance, other ICs that have embedded blocks may be tested using techniques and circuits similar to the ones described below.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
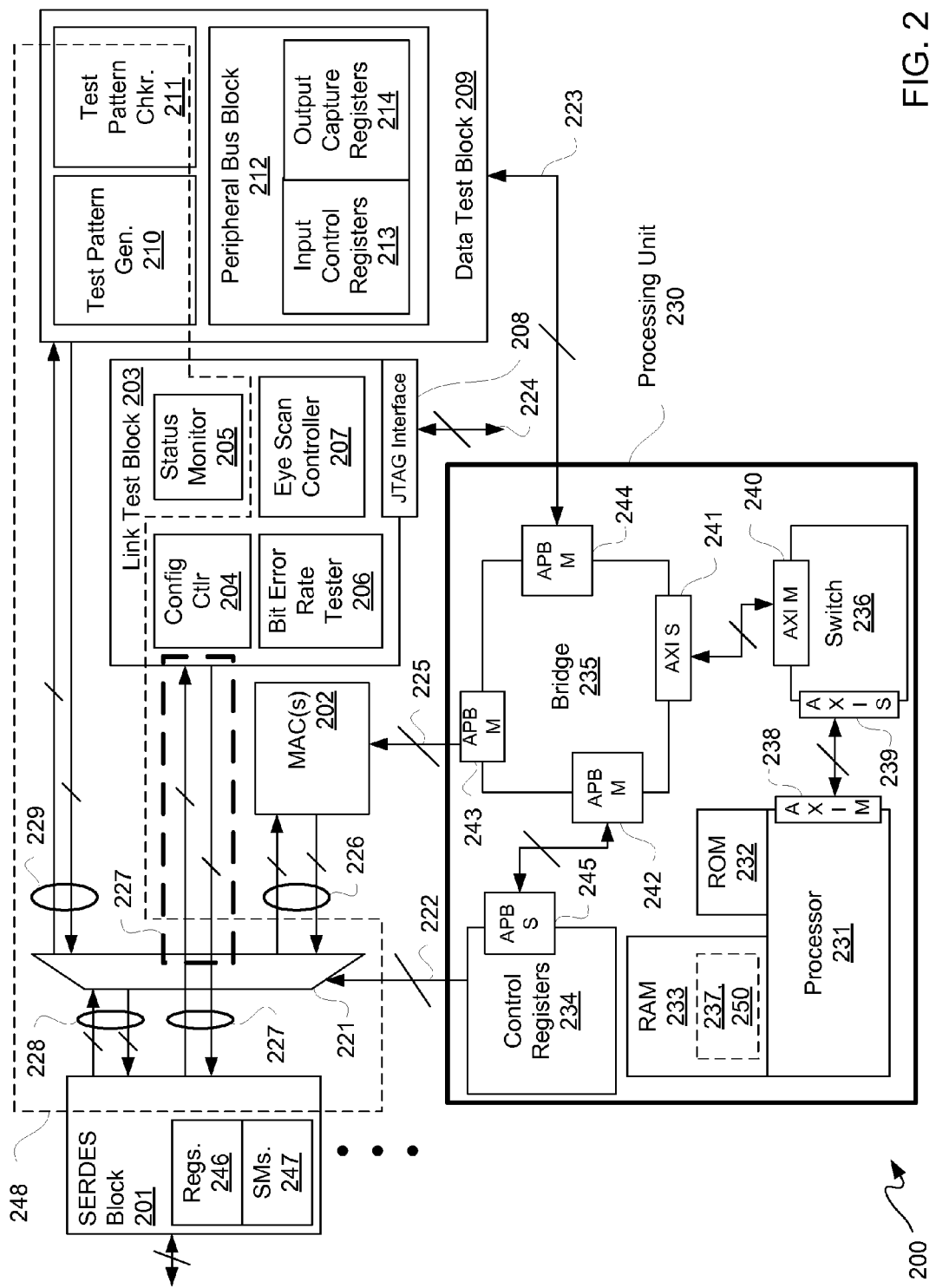
FIG. 2 is a block diagram depicting an exemplary system-on-chip ("SoC").

FIG. 2 is a block diagram depicting an exemplary system-on-chip ("SoC") 200. FPGA 100 of FIG. 1 may be such an SoC 200, which may be a monolithic die or a multi-die stack or package as previously described, including without limitation stacked silicon interconnect technology ("SSIT").

SoC 200 includes one or more serializer-deserializer blocks ("SERDES") 201, an input/output interface 221, a data test block 209, a processing unit 230, a link test block 203, and one or more media access controllers ("MACs") 202. Along those lines, SoC 200 may be entirely formed using dedicated or embedded hardware blocks. Accordingly, SERDES 201 may not be directly coupled to programmable fabric resources, and thus dedicated blocks 203 and 209 may be used for testing SERDES 201, as described below in additional detail.

In this example, input/output interface 221 is illustratively depicted as a bidirectional multiplexer; however, in other configurations of an input/output interface, other circuitry, namely other than a bidirectional multiplexer, may be used. A multiplexer 221 may be used to select any one SERDES 201 for data test block 209 via data test block interface 229 under control of processor 231 via control select signals 222.

Additionally, in this example, it shall be assumed that SERDES 201 is configured to perform 8b/10b encoding. In other words, if 8, 16, 24, etc. data or other information bits are input to SERDES 201, SERDES 201 may output corresponding 10, 20, 30, etc. bits which includes such data or other information bits as well as coding bits. However, in other configurations of a SERDES, other coding, namely other than 8b/10b coding, may be used.

Processing unit 230 may be coupled to input/output interface 221 to provide control select bus/signals 222 thereto to control access to and from SERDES 201. Data test block 209 may be coupled to SERDES 201 through input/output interface 221. Processing unit 230 may be coupled to data test block 209 via bidirectional bus/signaling 223. To allow data test block 209 to control SERDES 201, test code or other software may write to a register in input control registers 234 used to control access to SERDES 201 via input/output interface 221.

Processing unit 230 may include a processor 231, a read only memory ("ROM") 232, a random access memory ("RAM") 233, control registers 234, a microcontroller interface/bus-to-peripheral bus bridge ("bridge") 235, and a microcontroller interface/bus switch ("switch") 236. Processor 231 may include one or more cores, and may be a central processing unit. Even though processing unit 230 is described as being an ARM processing unit, it should be understood that any processing unit may be used in accordance with the description herein. Along those lines, it shall be assumed that bridge 235 is an AXI-to-APB bridge and that switch 236 is an AXI switch. However, AXI and/or APB are ARM specific, and other types of processing unit infrastructure may be used.

Processor 231 may be coupled to ROM 232 to execute boot code stored therein to boot SoC 200. Processor 231 may further be coupled to RAM 233 to execute test code 237, where test code 237 is loaded into RAM 233 and executed under control of processor 231 in order to test SERDES 201, as described below in additional detail. Processor 231 may include an AXI master 238 coupled for communicating with an AXI slave 239 of switch 236. Switch 236 may include an AXI master 240 coupled for communicating with an AXI slave 241 of bridge 235. Bridge 235 may include APB masters 242, 243 and 244. APB master 242 may be coupled for communicating with APB slave 245 of control registers 234. Along those lines, under control of processor 231, test code 237 may write to control registers 234 to cause control registers 234 provide control signaling via control bus/signals 222 to input/output interface 221. APB master 243 may be coupled for communicating with MACs 202 via media bus/signals 225. APB master 244 may be coupled for communicating with a peripheral bus block 212, which for this example may be an APB slave block, of data test block 209. Peripheral bus block 212 may include input control registers 213 and output capture registers 214. Input control registers 213 and output capture registers 214 may be accessible via processing unit 230 under control of test code 237, as described below in additional detail.

Processor 231 may controllably execute test code 237, where such test code 237 includes coding for at least one test pattern for testing SERDES 201. Input control registers 213 may be written, under control of such test code 237, to cause such at least one test pattern to be provided to SERDES 201. By allowing test code 237 or other software to implement product test patterns, such software implementable product test patterns may be more easily upgraded than conventional hardcoded test patterns.

Data test block 209 may further include a test pattern generator 210 and a test pattern checker 211. Responsive to writing to input control registers 213, such test pattern generator 210, coupled to such input control registers 213, may generate at least one such test pattern for providing data to SERDES 201 via input/output interface 221. In this example, test pattern generator 210 is a linear feedback shift register ("LFSR") and pseudo-random bit sequence ("PRBS") generator, and test pattern checker 211 is an LFSR and PRBS checker. For example, test code 237 may select from a variety of PRBS patterns as well as LFSR Seeds, configure LFSR/PRBS generator 210 and checker 211 to generate and check test data. Input control registers 213 may be used to control test pattern generation by test pattern generator 210 responsive to a test pattern specified in test code 237. However, other types of test pattern generators and checkers may be used.

A test pattern may be provided under control of test pattern generator 210 to SERDES 201 for loopback to test pattern checker 211. Such loopback may be an internal only loopback, namely entirely within a SoC 200, or may include an external device for loopback. SERDES 201 may loop back such test pattern data for receipt by test pattern checker 211. Output capture registers 214, coupled to test pattern checker 211, may capture data or other information output from test pattern checker 211. Such capture data may be provided back to processing unit 230, such as for subsequent analysis. For example, output capture registers 214 may be used to capture data sequences and data errors determined by test pattern checker 211 responsive to a test pattern specified by test code 237. Along those lines, test pattern checker 211 may be coupled to input control registers 213 in order to have knowledge of a test pattern to be used. For a pseudo-random bit sequence, it should be appreciated that after a number of clock cycles of a clock signal (not shown for purposes of clarity) such pseudo-random bit sequence may repeat. Thus, test pattern checker 211 may have knowledge of what to anticipate.

SoC 200 further includes a link test block 203. Link test block 203 includes configuration controller 204, a status monitor 205, bit error rate tester 206, an eye scan controller 207, as well as a test input output interface ("test interface") 208. In this example, test interface 208 is a JTAG interface. Test bus/signals 224, coupled to test interface 208, may be used for bidirectional communication with test interface 208. Test bus/signals 224 may be for communication with a computer system, such as a workstation or other computer system, running test software. Link test block 203 may thus be responsible for facilitating link tuning and/or characterization. A JTAG interface 208 may be used to couple to a JTAG chain of a processor system. Along those lines, link test block 203 may be controlled via JTAG to allow user control via software running on a PC or other workstation for example. Along those lines, analog configuration parameters of SERDES 201 may be controlled and/or adjusted while running a data pattern through such SERDES 201 and while counting bits, errors, or other parameters.

Bus 224 may be used to communicate with link test block 203 in a non-invasive manner with respect to operation of processing unit 230. In other words, because link test block is not operated by or driven by test code 237, or more generally by processing unit 230, operation of link test block 203 need not interfere or otherwise burden processing unit 230. Furthermore, link test block 203 may be operated in parallel with execution of test code 237 for testing SoC 200, as described below in additional detail.

MACs 202 may be coupled to input/output interface 221 via input/output bus 226. Data test block 209 may be coupled to input/output interface 221 via input/output bus 229. Input/output interface 221 is coupled to SERDES 201 via input/ output bus 228. However, SERDES 201 may be directly coupled to link test block 203 via input/output bus 227, so as not to have to go through processing unit 230. Optionally, input/output bus 227 may be coupled to input/output bus 228 via input/output interface 221 for communication between SERDES 201 and link test block 203. Input/output buses 226 through 229 may be for data, control, and address signaling, among other signals, which are not differentiated here for purposes of clarity and not limitation.

Link test block 203 may be separately controllable via test interface 208 to adjust operating parameters of at least one SERDES 201 during operation thereof, such as for example to optimize a data eye. Along those lines, such at least one SERDES 201 may be of an analog design, and so such operating parameters may include at least one analog parameter. Such at least one SERDES 201 may include control registers 246 and one or more finite state machines 247. Configuration controller is configured 204 may be coupled to at least one SERDES 201 to control, such as write, read, set, and reset, control registers 246 to adjust at least one of such operating parameters during operation of such at least one SERDES 201. Such control of control registers 246 may be independent of processing unit 230. Status monitor 205 may be coupled to monitor status of at least one SERDES and to capture each error output from such at least one SERDES on clock cycle granularity. State machines 247 may be used to indicate such status, such as for example SERDES states if an encoding error and/or running disparity error, which are on an associated clock cycle basis, which status as indicated by state machines 247 may be monitored by status monitor 205. Because of such clock cycle dependency for providing a test pattern to, reading a test pattern and other information from, and monitoring status of SERDES 201, an SoC-side portion of SERDES 201, test pattern generator 210, test pattern checker 211, and status monitor 205 may operate in a same clock domain 248. Status monitor 205 may include a first-in, first-out buffer for clocking information into such buffer as associated with clock domain 248. However, status information need not, but may, be clocked out of such status monitor at a clock rate of clock domain 248. Clock domain 248 may be adjusted up or down to provide different data rates. Along those lines, clock domain 248 may be a test clock domain.

Bit error rate ("BER") tester 206 may be configured to determine a bit error rate using a test pattern. For example, BER tester 206 may lock on each clock cycle of clock domain 248 in increments of 8 bits or some other number of bits for a clock cycle. However, BER tester 206 may determine BER over a much larger interval of time. Thus, a BER may be specified for each of a plurality of link rates. Test interface 208 may be used to provide a test pattern or at least a sufficient amount of test pattern information to BER tester 206 to configure BER tester 206 to provide such BERs.

Generally, BER is more relevant to bits after they have left, and of course returned in some form or another to, SoC 200 die. Along those lines, SoC 200 may have a test PCB or something with test traces on a blank board, may be coupled via a test PBC to a test part, and/or to test equipment. Thus, for example, BER may be for some FR4 or other circuit board material for some distance of travel at a data rate.

Processing unit 230 may be coupled to receive an application 250 into RAM 233 for execution thereof involving application data provided to at least one SERDES 201 via one or more MACs 202 coupled to input/output interface 221 and to processing unit 230. Embedded MACs 202 may be for various industry protocols, including without limitation Ethernet, supported by SoC 200. MACs 202 may be used for running applications, such as user applications for example, on SoC 200.

Eye scan controller 207 may be configured to determine a data eye for such application data during execution of such application, such as by processing unit 230. Again, input/output bus 227 may provide a separate path for simultaneous operation of an application executed by processor 231 while collecting application data thereof by eye scan controller. In other words, application data flow via input/output bus 226 may be separate from flow of such application data via input/output bus 227. This facilitates a user to monitor a data eye and adjust operation of SERDES 201 at the same time via configuration controller 204 to adjust such data eye. Configuration controller 204 may, responsive to a data eye of a SERDES 201, be used to adjust where registers 246 sample. In other words, configuration controller 204 may be used to control where registers 246 sample at different points of time within a data eye, including without limitation above and below threshold. Eye scan registers of eye scan controller 207 may be used to store such samples, and eye scan controller 207 may be coupled to configuration controller 204 to indicate to registers 246 of SERDES 201 as to where to read samples. Eye scan registers of registers 246 may thus only hold individual samples, and eye scan controller 207 may be used to indicate where and when to take samples and store samples such samples taken by registers 246.

To summarize, generally data test block 209 may be used to determine if a SERDES 201 works in a clearly defined configuration using test pattern generated data which is looped back. Generally, link test block 203 on the other hand can be used to determine a quality of result, namely quality of operation of a SERDES 201.

Figure 3:
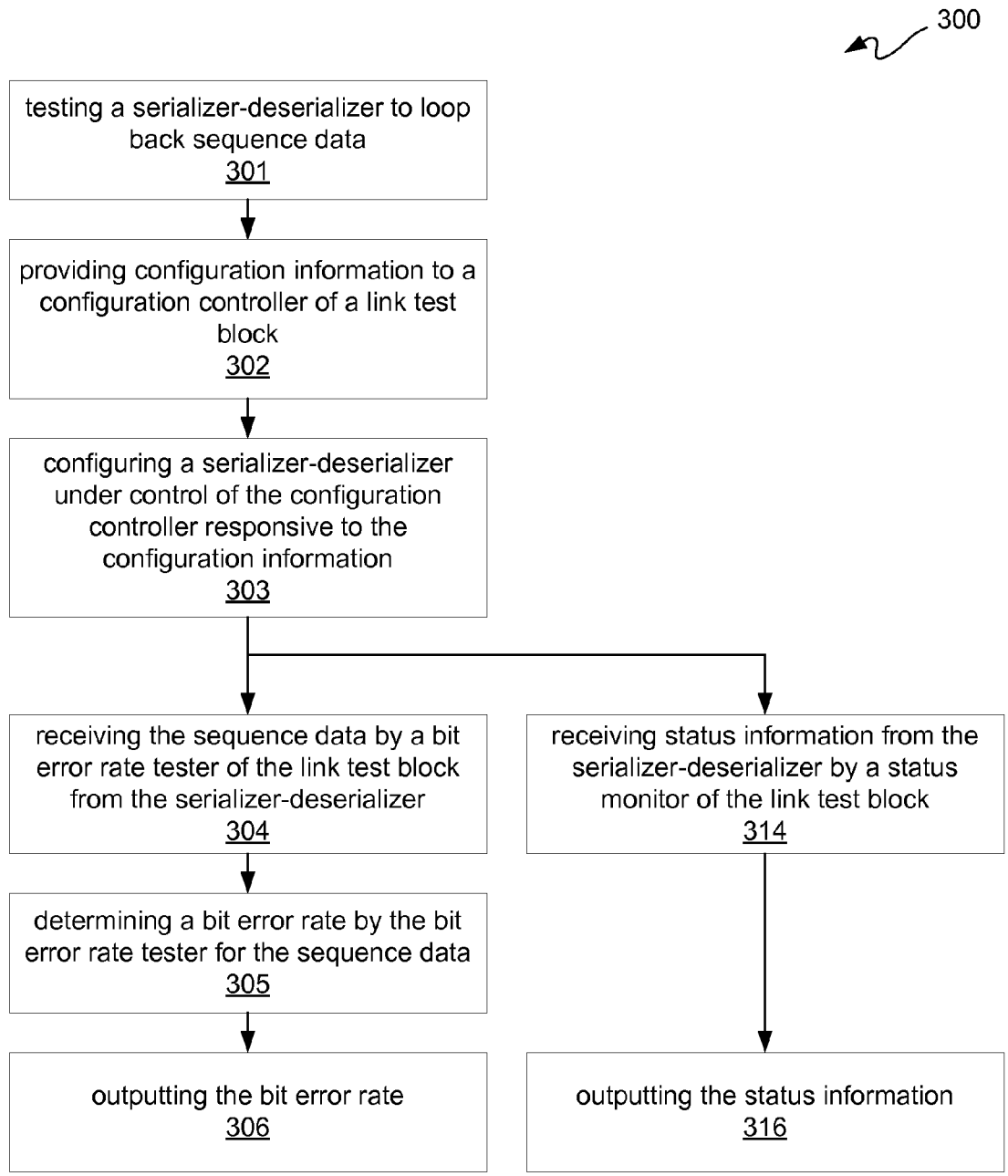
FIG. 3 is a flow diagram depicting an exemplary analog block test flow.

FIG. 3 is a flow diagram depicting an exemplary analog block test flow 300. Test flow 300 is further described with simultaneous reference to FIGS. 2 and 3.

At 301, a SERDES 201 is tested to loop back a sequence of data ("data sequence"). At 302, configuration information may be provided to a configuration controller 204 of a link test block 203, such as via test interface 208. At 303, SERDES 201 is configured under control of configuration controller 204 responsive to such configuration information. At 304, such data sequence may be received by a BER tester 206 of link test block 203 from SERDES 201. BER tester 206 may be configured with test pattern information at 303. Sequence data may thus be responsive to a test pattern associated with such test pattern information. At 305, a bit error rate may be determined by BER tester 206 for such data sequence. At 306, such bit error rate may be output at 306.

In parallel or separately from receiving such data sequence for BER, at 314, status information may be received by a status monitor 205 of link test block 203. Such status information may be from one or more state machines 247 of SERDES 201. Such status information may be independently bused from SERDES 201 with respect to such data sequence looped back. At 316, such status information may be output.

Figure 4:
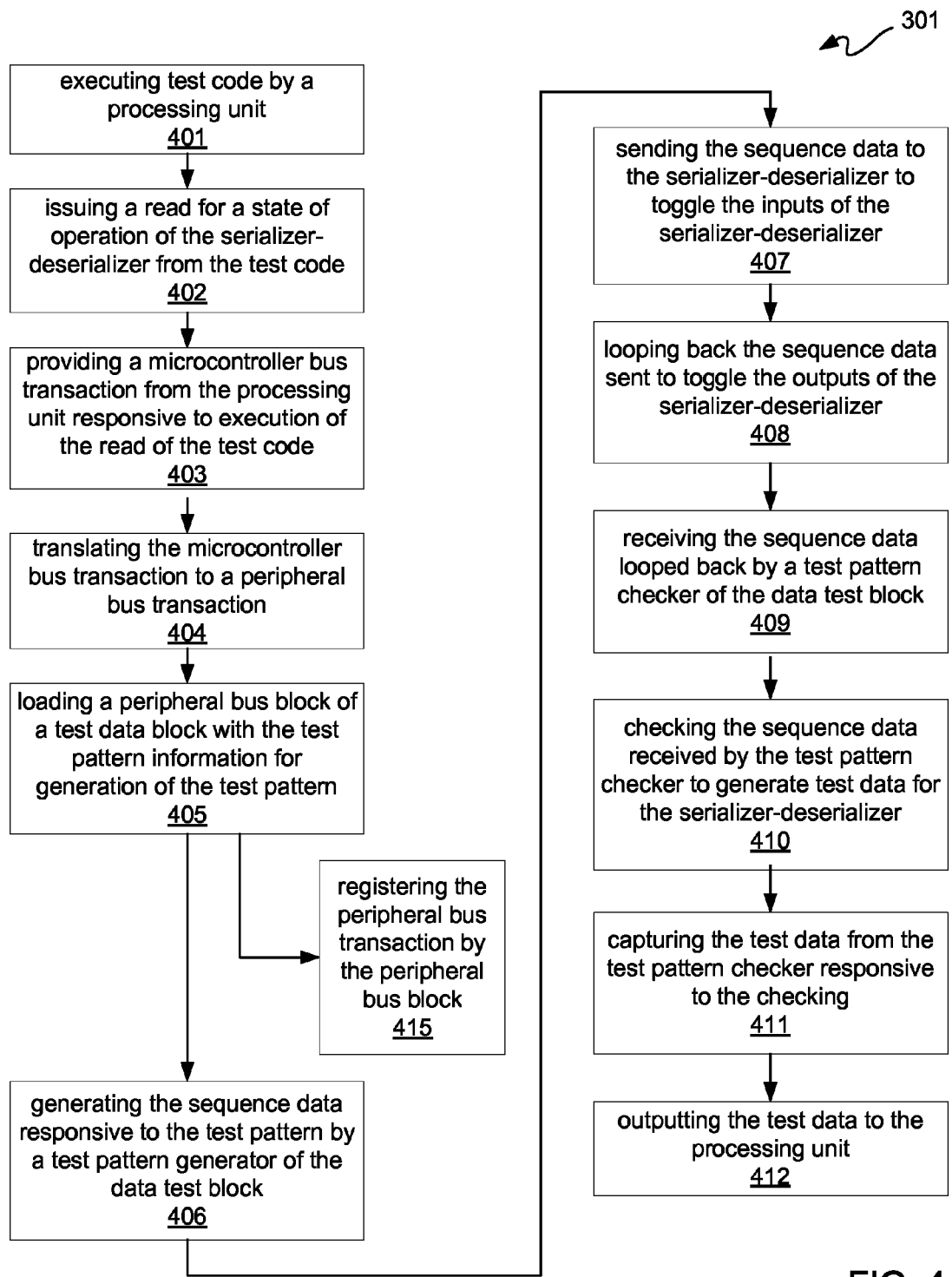
FIG. 4 is a flow diagram depicting an exemplary loopback test flow for the test flow of FIG. 3.

FIG. 4 is a flow diagram depicting an exemplary loopback test flow 301 for test flow 300. Test flow 301 is further described with simultaneous reference to FIGS. 2 through 4. Test flow 301 may use data test block 209 in parallel with use of link test block 203.

At 401, test code 237 may be executed by a processing unit 230. Test code 237 includes test pattern information, which may be handed down as follows. Test code 237 may be configured to toggle inputs and outputs of SERDES 201. At 402, a read for a state of operation of SERDES 201 may be issued from test code 237. At 403, a microcontroller bus transaction, such as for switch 236, may be provided from processing unit 230 responsive to execution of such read of test code 237. At 404, such microcontroller bus transaction may be translated, such as by bridge 235, to provide a peripheral bus transaction. Such toggling of inputs and outputs of SERDES 201 may be involve loading a peripheral bus block 212 of a test data block 209 with such test pattern information for generation of a test pattern. This loading may thus be controlled by test code 237 executed by processing unit 230. Along those lines, an operation at 405 may include registering, such as with input control registers 213, such peripheral bus transaction at 415 by peripheral bus block 212 of data test block 209 to load peripheral bus block 212 with test pattern information.

At 406, such data sequence may be generated responsive to such test pattern by a test pattern generator 210 of data test block 209. At 407, such data sequence may be sent to SERDES 201 to toggle inputs of SERDES 201. Such data sequence, or at least a version thereof, may be looped back or otherwise sent at 408 to toggle outputs of SERDES 201. At 409, such data sequence looped back may be received by a test pattern checker 211 of data test block 209. Such data sequence received by test pattern checker 211 may be checked at 410 to generate test data for SERDES 201. At 411, such test data may be captured, such as by output capture registers 214, from test pattern checker 211 responsive to such checking. Such test data may be output at 412 to processing unit 230, such as via input/output bus 223. Test interface 208 may be used for providing of configuration information at 302, output of status information at 316, and output of BER at 306 independently with respect to execution of test code 237 by processing unit 230, for example at 401.

Figure 5:
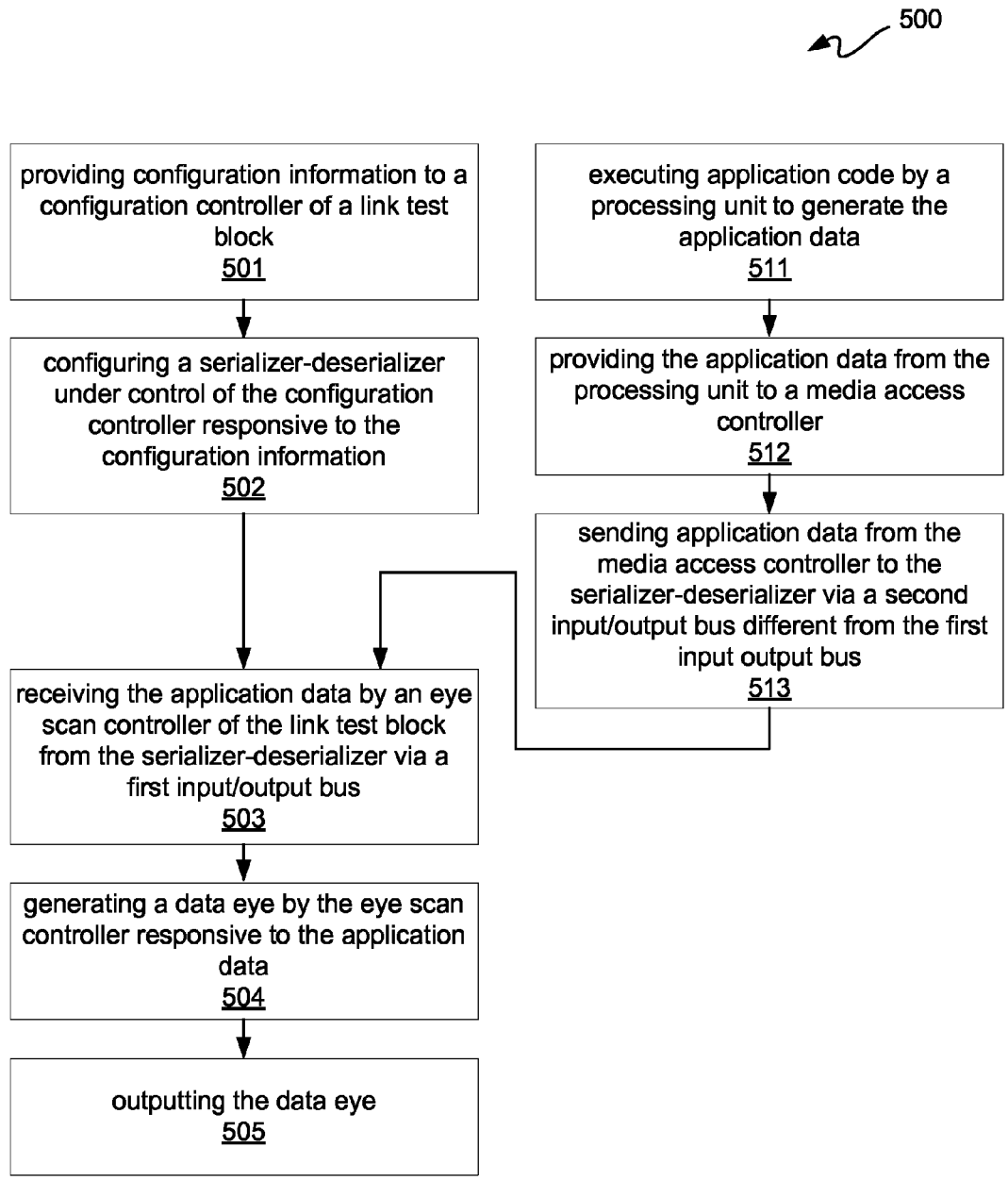
FIG. 5 is a flow diagram depicting exemplary data eye generation flow.

FIG. 5 is a flow diagram depicting an exemplary data eye generation flow 500. Test flow 500 is further described with simultaneous reference to FIGS. 2 and 5.

At 501, configuration information may be provided to a configuration controller 204 of a link test block 203. At 502, a SERDES 201 may be configured under control of configuration controller 204 responsive to such configuration information.

At 511, application code 250 may be executed by a processing unit 230 to generate application data. Such application data may be provided at 512 from processing unit 230 to a MAC 202. At 513, such application data may be sent from such MAC 202 to a SERDES 201 via an input/output bus 226 which is independent from input output bus 227. Such application data may thus be generated in parallel with outputting at 505 of a data eye, as described below in additional detail.

At 503, application data, from a SERDES 201 via a MAC 202 as previously described, may be received by an eye scan controller 207 of link test block 203 from SERDES 201 via input/output bus 227. At 504, a data eye may be generated by eye scan controller 207 responsive to application data. Such data eye, which may be for settings of SERDES 201 responsive to such configuration information, may be output at 505.

Even though the above description was in terms of controlling an analog-based SERDES, the above-description likewise applies to other blocks having analog parameters affecting a data eye, such as for example an analog-to-digital converter. In short, any block having analog components where tuning and/or characterization thereof may be useful. Thus, a BER tester, as well as software implementable product test features, for analog blocks are provided for an SoC.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
   a system-on-chip having at least one analog block, an input/output interface, and a processing unit;
   a data test block coupled to the at least one analog block through the input/output interface; and
   a link test block coupled to the at least one analog block, wherein the link test block comprises a test interface;
   wherein the processing unit is coupled to the input/output interface to control access to the at least one analog block;
   wherein the processing unit is coupled to the data test block and configured to execute test code having at least one test pattern;
   wherein the data test block under control of the test code executed by the processing unit is configured to test the at least one analog block with the test pattern; and
   wherein the link test block is separately controllable via the test interface to adjust operating parameters of the at least one analog block during the execution of the test code.

2. The apparatus according to claim 1, wherein the data test block comprises input control registers, output capture registers, a test pattern generator, and a test pattern checker.

3. The apparatus according to claim 2, wherein the test pattern generator comprises a linear feedback shift register and pseudo-random bit sequence generator.

4. The apparatus according to claim 2, wherein the test pattern checker comprises a linear feedback shift register and pseudo-random bit sequence checker.

5. The apparatus according to claim 2, wherein the input control registers and the output capture registers are accessible via the processing unit under control of the test code.

6. The apparatus according to claim 5, wherein:
   the input control registers are to control test pattern generation by the test pattern generator responsive to the test pattern;
   the output capture registers are to capture data sequences and data errors determined by the test pattern checker responsive to the test pattern; and
   the test pattern is provided under control of the test pattern generator to the at least one analog block for loopback to the test pattern checker;
   wherein the at least one analog block is at least one serializer-deserializer.

7. The apparatus according to claim 5, wherein the link test block is coupled to the at least one analog block through the input/output interface.

8. The apparatus according to claim 7, wherein the link test block comprises a configuration controller, a status monitor, a bit error rate tester, and an eye scan controller.

9. The apparatus according to claim 8, wherein:
   the link test block is separately controllable via the test interface to adjust the operating parameters of the at least one analog block during operation thereof; and
   the at least one analog block is at least one serializer-deserializer.

10. The apparatus according to claim 9, wherein the operating parameters comprise at least one analog parameter.

11. The apparatus according to claim 10, wherein:
    the at least one serializer-deserializer includes control registers and finite state machines;

the configuration controller is configured to control the control registers to adjust at least one of the operating parameters during operation of the at least one serializer-deserializer; and the status monitor is coupled to monitor status of the at least one serializer-deserializer and to capture each error output from the at least one serializer-deserializer on clock cycle granularity.

12. The apparatus according to claim 8, wherein:
the bit error rate tester is configured to determine a bit error rate using the test pattern; and
the test interface is coupled to provide the test pattern to the bit error rate tester.

13. The apparatus according to claim 8, wherein:
the processing unit is coupled to execute an application involving application data provided to the at least one analog block via an access controller coupled to the input/output interface and the processing unit;
the eye scan controller is configured to determine a data eye for the application data during execution of the application; and
the at least one analog block is at least one serializer-deserializer.

14. A method, comprising:
coupling a processing unit to an input/output interface to control access to an analog block to enable the execution of test code;
testing, by the processing unit, the analog block to loop back a data sequence using a data test block;
providing configuration information to a configuration controller of a link test block;
configuring an analog block under control of the configuration controller responsive to the configuration information;
receiving the data sequence by a bit error rate tester of the link test block from the analog block;
wherein the bit error rate tester is configured with test pattern information;
wherein the data sequence is responsive to a test pattern associated with the test pattern information;
determining a bit error rate by the bit error rate tester for the data sequence;
outputting the bit error rate; and
adjusting, by the configuration controller of the link test block, operating parameters of the analog block during the execution of the test code.

15. The method according to claim 14, wherein the analog block is a serializer-deserializer, and wherein the testing comprises:
executing test code by a processing unit;
wherein the test code includes the test pattern information;
wherein the test code is configured to toggle inputs and outputs of the serializer-deserializer by,
loading a peripheral bus block of the data test block with the test pattern information for generation of the test pattern;
wherein the loading is controlled by the test code executed by the processing unit;
generating the data sequence responsive to the test pattern by a test pattern generator of the data test block;
sending the data sequence to the serializer-deserializer to toggle the inputs of the serializer-deserializer;
looping back the data sequence sent to toggle the outputs of the serializer-deserializer;
receiving the data sequence looped back by a test pattern checker of the data test block;
checking the data sequence received by the test pattern checker to generate test data for the serializer-deserializer;
capturing the test data from the test pattern checker responsive to the checking; and
outputting the test data to the processing unit.

16. The method according to claim 15, wherein the testing further comprises;
issuing a read for a state of operation of the serializer-deserializer from the test code;
providing a microcontroller bus transaction from the processing unit responsive to execution of the read of the test code; and
translating the microcontroller bus transaction to a peripheral bus transaction;
wherein the loading comprises registering the peripheral bus transaction by the peripheral bus block of the data test block to load the peripheral bus block with the test pattern information.

17. The method according to claim 16, further comprising:
receiving status information from the serializer-deserializer by a status monitor of the link test block;
wherein the status information is from a state machine of the serializer-deserializer;
wherein the status information is independently bused from the serializer-deserializer with respect to the data sequence looped back; and
outputting the status information.

18. The method according to claim 17, wherein the link test block comprises a test interface for the providing of the configuration information, the output of the status information, and the outputting of the bit error rate independently with respect to execution of the test code by the processing unit.

19. A method comprising:
providing configuration information to a configuration controller of a link test block;
configuring an analog block under control of the configuration controller responsive to the configuration information;
receiving application data by an eye scan controller of the link test block from the analog block via a first input/output bus;
generating a data eye by the eye scan controller responsive to the application data;
wherein the data eye is for settings of the analog block responsive to the configuration information;
outputting the data eye;
adjusting, by the configuration controller of the link test block, operating parameters of the analog block;
executing application code by a processing unit to generate the application data;
providing the application data from the processing unit to a media access controller; and
sending the application data from the media access controller to the analog block via a second input/output bus independent from the first input/output bus;
wherein the application data is generated in parallel with outputting of the data eye.

* * * * *